United States Patent
Aronowitz et al.

[11] Patent Number: 5,837,598
[45] Date of Patent: Nov. 17, 1998

[54] DIFFUSION BARRIER FOR POLYSILICON GATE ELECTRODE OF MOS DEVICE IN INTEGRATED CIRCUIT STRUCTURE, AND METHOD OF MAKING SAME

[75] Inventors: Sheldon Aronowitz, San Jose; Valeriy Sukharev, Cupertino; Jon Owyang, San Jose; John Haywood, Santa Clara, all of Calif.

[73] Assignee: LSI Logic Corporation, Milpitas, Calif.

[21] Appl. No.: 816,254

[22] Filed: Mar. 13, 1997

[51] Int. Cl.$^6$ .................................................. H01L 21/425
[52] U.S. Cl. .......................... 438/532; 438/653; 438/657
[58] Field of Search .................................... 438/289, 305, 438/306, 530, 532, 653, 657, 792

[56] References Cited

U.S. PATENT DOCUMENTS

| | | | |
|---|---|---|---|
| 4,897,368 | 1/1990 | Kobushi et al. | 438/657 |
| 5,567,638 | 10/1996 | Lin et al. | 438/532 |
| 5,712,181 | 1/1998 | Byun et al. | 438/532 |

*Primary Examiner*—Chandra Chaudhari
*Attorney, Agent, or Firm*—John P. Taylor

[57] ABSTRACT

A uniformly doped polysilicon gate electrode of an MOS device forming a part of an integrated circuit structure on a semiconductor substrate is formed by first depositing a very thin layer of amorphous or polycrystalline silicon, e.g., from about 2 nm to about 10 nm, over a gate oxide layer. The thin layer of silicon layer is then exposed to a nitrogen plasma formed from $N_2$ at a power level sufficient to break the silicon—silicon bonds in the thin layer of silicon, but insufficient to cause sputtering of the silicon to cause a barrier layer of silicon and nitrogen to form at the surface of the thin silicon layer. Further silicon, e.g., polysilicon, is then deposited over the barrier layer to the desired thickness of the polysilicon gate electrode. The gate electrode is then conventionally doped, i.e., by implantation followed by furnace annealing, to diffuse and activate the dopant in the polysilicon gate electrode without, however, resulting in penetration of the dopant through the barrier layer into the underlying gate oxide layer or the semiconductor substrate.

15 Claims, 2 Drawing Sheets

FORMING A THIN LAYER OF AMORPHOUS OR POLYCRYSTALLINE SILICON OVER A GATE OXIDE LAYER ON AN MOS STRUCTURE FORMED ON A SEMICONDUCTOR SUBSTRATE

↓

EXPOSING THE THIN LAYER OF SILICON TO A NITROGEN PLASMA FORMED FROM $N_2$ GAS TO FORM A BARRIER LAYER OF SILICON AND NITROGEN

↓

DEPOSITING SUFFICIENT POLYSILICON OVER THE BARRIER LAYER OF SILICON AND NITROGEN TO FORM A POLYSILICON GATE ELECTRODE LAYER

↓

DOPING THE POLYSILICON GATE ELECTRODE LAYER BY IMPLANTING IT WITH A DOPANT AND THEN ANNEALING THE POLYSILICON LAYER TO DIFFUSE AND ACTIVATE THE DOPANT UNIFORMLY THROUGH THE POLYSILICON LAYER ABOVE THE BARRIER LAYER OF SILICON AND NITROGEN

FIG. 1

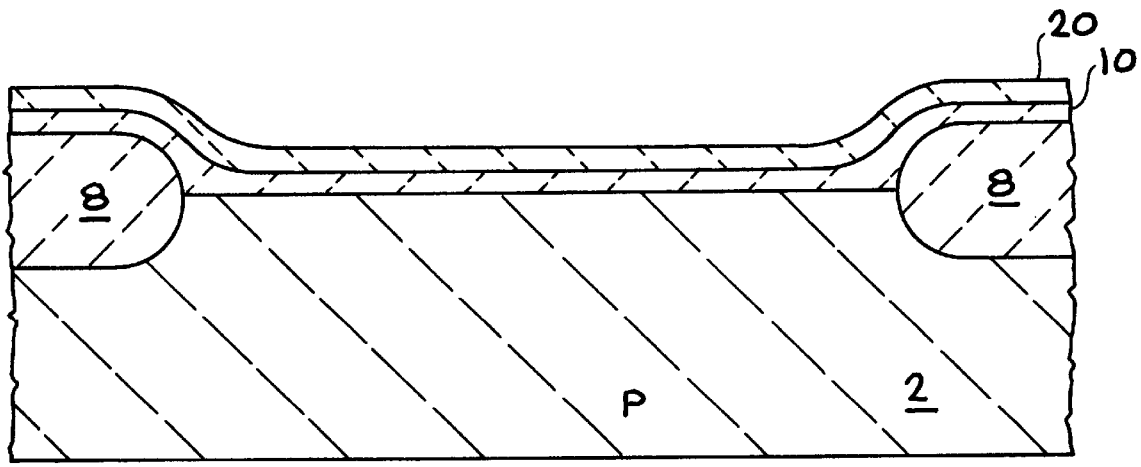

FIG. 2

DIFFUSION BARRIER FOR POLYSILICON GATE ELECTRODE OF MOS DEVICE IN INTEGRATED CIRCUIT STRUCTURE, AND METHOD OF MAKING SAME

BACKGROUND OF THE INVENTION

1. Field of the Invention

This invention relates to the construction of an MOS device in an integrated circuit structure on a semiconductor substrate. More particularly, this invention relates to construction of a polysilicon gate electrode of an MOS device wherein a barrier layer of silicon and nitrogen is formed between the polysilicon gate electrode and the underlying gate oxide to inhibit diffusion of dopant through the polysilicon to the gate oxide and underlying semiconductor substrate.

2. Description of the Related Art

In the construction of an integrated circuit structures comprising an MOS device on a semiconductor substrate, the reduction of device geometries has resulted in a reduction in thickness of the polysilicon gate electrode over the gate oxide portion of the MOS device. This reduction of polysilicon gate electrode thickness, i.e., reduction down to a thickness of about 250 nanometers (nm) or less, plus the reduced thermal budgets involved in deep submicron devices (less exposure to heat) has created problems in attaining uniform diffusion of dopant throughout the polysilicon gate electrode.

Failure of the dopant to uniformly diffuse through the polysilicon gate electrode results in the creation of depletion effects associated with low dose regions of the polysilicon gate electrode and thereby increases the effective gate dielectric thickness, resulting in a shifting of the turn on voltage threshold (Vt). In other words, failure of the dopant to uniformly diffuse throughout the polysilicon gate electrode causes the undoped or underdoped regions of the polysilicon gate electrode to act as an insulator, i.e., thereby effectively increasing the thickness of the gate oxide dielectric, resulting in an undesirable shift in the Vt.

While increasing the thermal budget would result in a more uniform diffusion of the dopant through the polysilicon gate electrode, it would also permit more diffusion of the dopant into the gate oxide, and through the gate oxide into the underlying substrate.

Thus, the use of too much heat during the annealing step, while achieving more uniform diffusion of the dopant throughout the polysilicon gate electrode, can result in dopant penetration into and through the gate oxide, while too little heat in the annealing step can result in non-uniform diffusion of the dopant throughout the polysilicon gate electrode, resulting in undoped portions of the polysilicon gate electrode acting as insulating portions of the polysilicon gate electrode.

It has been proposed to solve this problem by the use of rapid thermal anneal (RTA) techniques, i.e., an anneal carried out at a high temperature for a short time period to provide a high temperature anneal without prolonged exposure to the annealing temperature.

However, it has been found that conventional RTA does not sufficiently heat the substrate to get uniform distribution and activation of the dopant throughout the polysilicon gate electrode, with the dopant rather moving at a faster rate along the grain boundaries between adjacent crystals of the polysilicon, and this grain boundary dopant then penetrating through the underlying gate oxide before the remainder of the polysilicon gate electrode has been sufficiently annealed to achieve the desired uniform distribution and activation of dopant.

It has also been proposed to nitridize the polysilicon gate electrode with $NH_3$ to create a barrier layer or region of silicon nitride within the polysilicon electrode to prevent the dopant from reaching the gate oxide. However, the polysilicon portion of the gate electrode below this barrier region must be sufficiently thick to minimize exposure of the gate oxide and underlying silicon substrate surface to hydrogen atoms or molecules liberated from the $NH_3$ as it reacts with the silicon to form the desired silicon nitride. This released hydrogen can result in the formation of undesirable interfaces or traps in either the gate oxide or the underlying substrate. To protect the gate oxide and semiconductor substrate from this released hydrogen, an unacceptably large portion of the polysilicon gate electrode must be positioned between the silicon nitride barrier layer and the gate oxide, i.e., below the barrier layer. This polysilicon below the barrier layer would not be doped by the dopant (because the dopant would not penetrate through the barrier layer). Since such undoped polysilicon acts as an insulator, depletion effects, as discussed above, will again result in an undesirable shift in the Vt of the resulting MOS device.

It has also been suggested to form a silicon oxynitride barrier beneath the polysilicon gate electrode by reacting the silicon oxide comprising the gate oxide with NO, $NO_2$, or $NH_3$. However, the use of $NH_3$ again will cause the release of unacceptable amounts of hydrogen, while the use of NO and $NO_2$ does not result in sufficient formation of silicon oxynitride. Moreover the combination of such an incomplete formation of silicon oxynitride plus the small number of $SiO_2$ layers that make up a 7 nanometer (nm) gate oxide will result in a silicon oxynitride barrier layer that is still very permeable to dopant which may then pass through the silicon oxynitride barrier layer to the underlying semiconductor substrate.

In order to prevent boron penetration from the polysilicon into the oxide, for example, it is desirable to have the nitrided layer at the polysilicon/oxide interface. On the other hand, nitriding the oxide to form a barrier to dopant penetration results in a non-uniform barrier formation and is, in general, non-reproducible.

Therefore, it would be desirable to be able to uniformly dope a thin polysilicon gate electrode in a manner in which the underlying gate oxide and semiconductor substrate will not be penetrated by the dopant.

SUMMARY OF THE INVENTION

In accordance with the invention, a thin polysilicon gate electrode is doped in a manner in which the underlying gate oxide and semiconductor substrate is not penetrated by the dopant, by forming a dopant barrier at the polysilicon/gate dielectric interface. The polysilicon gate electrode of an MOS device, forming a part of an integrated circuit structure on a semiconductor substrate, is uniformly doped by first forming a very thin layer of amorphous or polycrystalline silicon, e.g., from about 2 nm to about 10 nm, over a gate oxide layer. The structure is then exposed to a nitrogen plasma formed from $N_2$ at a power level sufficient to break the silicon—silicon bonds in the thin layer of silicon, but insufficient to cause sputtering of the silicon, resulting in the formation of a barrier layer containing silicon and nitrogen at the surface of the thin silicon layer. Polysilicon is then deposited over the barrier layer to the desired thickness of the polysilicon gate electrode. The polysilicon gate electrode is then conventionally doped, i.e., by implantation followed by furnace annealing, to diffuse and activate the dopant in the polysilicon gate electrode without, however, resulting in penetration of the dopant through the barrier layer of silicon and nitrogen into the underlying gate oxide layer or the semiconductor substrate.

BRIEF DESCRIPTION OF THE DRAWINGS

FIG. 1 is a flowsheet illustrating the process of the invention.

FIG. 2 is a fragmentary vertical cross-sectional view of a semiconductor substrate having a gate oxide layer formed thereon with a thin layer of amorphous or polycrystalline silicon formed over the gate oxide layer.

DETAILED DESCRIPTION OF THE INVENTION

Figure 3:
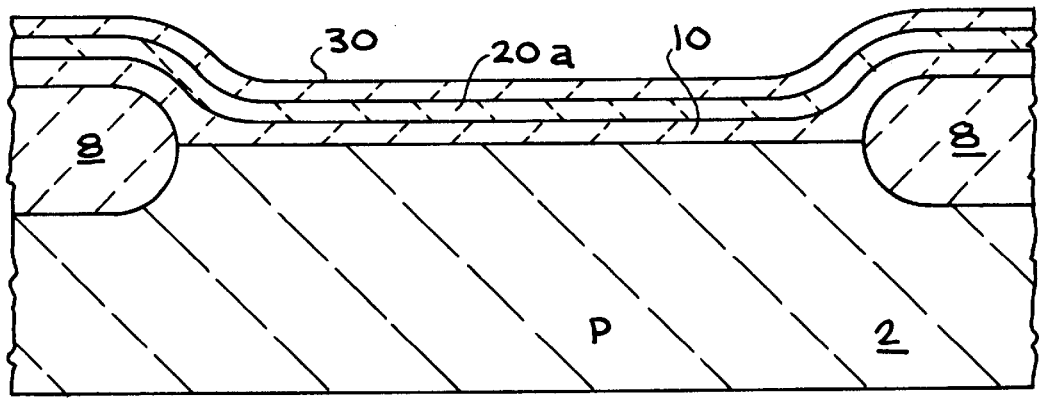
FIG. 3 is a fragmentary vertical cross-sectional view of the structure of FIG. 2 after exposure of the thin layer of amorphous or polycrystalline silicon to the nitrogen plasma to form the barrier layer of silicon and nitrogen.

Referring now to FIG. 2, a semiconductor substrate, such as a P doped silicon substrate 2, is shown with field oxide 8 surrounding a portion of substrate 2 wherein an MOS device (either NMOS or PMOS, with NMOS being illustrated) will be constructed in accordance with the invention. Formed over the structure is a conventional gate oxide layer 10. In accordance with the invention, a thin layer 20 of silicon, either amorphous or polycrystalline, is deposited over gate oxide portion 10, e.g., by chemical vapor deposition (CVD).

As shown in FIG. 3, silicon layer 20 is then exposed to a nitrogen plasma to cause the nitrogen in the plasma to enter silicon layer 20 to form the desired barrier layer 30 of silicon and nitrogen over gate oxide layer 10, with any remaining silicon from layer 20 not containing nitrogen being illustrated as layer 20a in FIG. 3. It will be understood that the representations of the thickness of the various layers in the drawings is not to scale, but are only shown for illustrative purposes. Whether or not any substantial amount of silicon not containing nitrogen remains between oxide layer 10 and barrier layer 30 will depend upon the initial thickness of silicon layer 20, and to some degree, the amount of time silicon layer 20 is exposed to the nitrogen plasma, as will be discussed below.

It should be noted that the exposure of thin silicon layer 20 to the nitrogen plasma is not believed to result in the formation of any significant amount of stoichiometric silicon nitride ($Si_3N_4$), as opposed to the formation of a surface region in silicon layer 20 containing silicon and nitrogen atoms therein, although there may be some reaction between the silicon and the nitrogen. The surface region of thin silicon layer 20 which contains such nitrogen atoms therein will, therefore, be referred to herein as a "barrier layer of silicon and nitrogen" or merely a "barrier layer".

Since the nitrogen atoms from the plasma apparently do not form specific compounds with the silicon, and since the dopant apparently diffuses faster along grain boundaries, the use of polysilicon may be preferred over amorphous silicon for the formation of silicon layer 20, since the nitrogen atoms then have an opportunity to enter into such already formed grain boundaries in the polysilicon, i.e., in essence to "stuff" the grain boundaries between the silicon crystals of the polycrystalline material with nitrogen atoms, thereby further inhibiting diffusion of the dopant through barrier layer 30. In contrast, amorphous silicon will form new grain boundaries during the subsequent anneal as the amorphous silicon crystallizes during the anneal, and such newly formed grain boundaries in the previously amorphous silicon will then not be filled with the nitrogen atoms.

However, amorphous silicon deposition offers a high degree of thickness control due to a slow rate of deposition. The rate of deposition of amorphous silicon is ⅕ that of polysilicon. This slow rate of deposition allows formation of a thin layer, i.e., from about 1 nanometer (nm) to about 10 nm, to be reproducible. The use of amorphous silicon also provides for the grain boundary to be unaligned to the subsequent grain structures from polysilicon deposition. This also will inhibit dopant diffusion by reducing direct columnar diffusion channels throughout the polysilicon to the polysilicon/gate dielectric interface.

Figure 4:
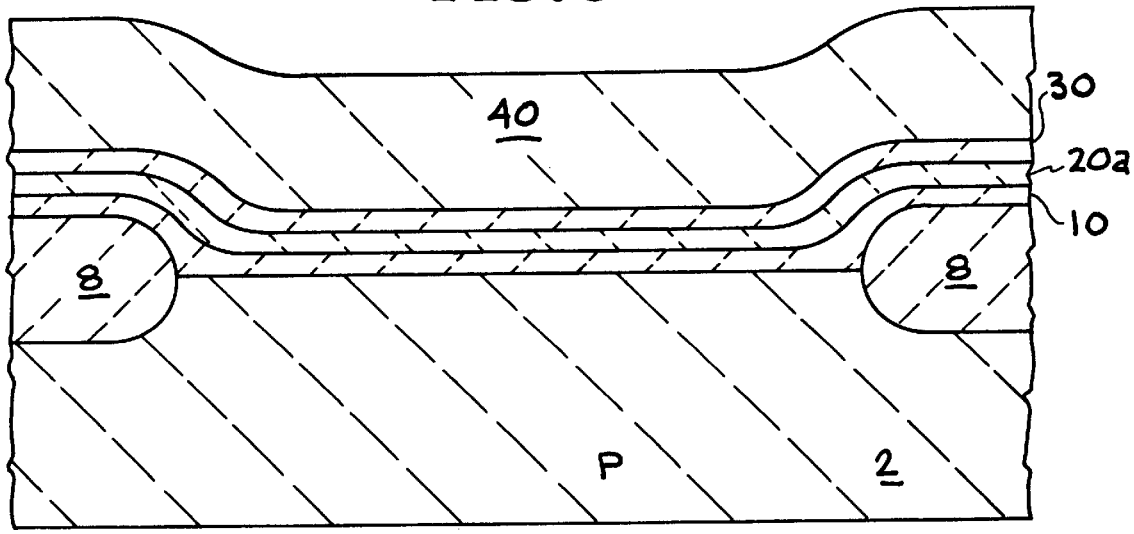
FIG. 4 is a fragmentary vertical cross-sectional view of the structure of FIG. 3 after formation and doping of a polysilicon layer over the barrier layer of silicon and nitrogen.

Following the formation of barrier layer 30, polysilicon gate electrode layer 40 is formed over the structure, as shown in FIG. 4. Polysilicon layer 40 is implanted and then annealed, with barrier layer 30 of silicon and nitrogen then functioning to prevent the dopant in polysilicon layer 40 from diffusing to and through gate oxide layer 10 to substrate 2 during the annealing step. The anneal may comprise a conventional furnace anneal carried out for a period of from about 15 minutes to about 60 minutes at a temperature of from about 600° C. to about 900° C.

Figure 5:
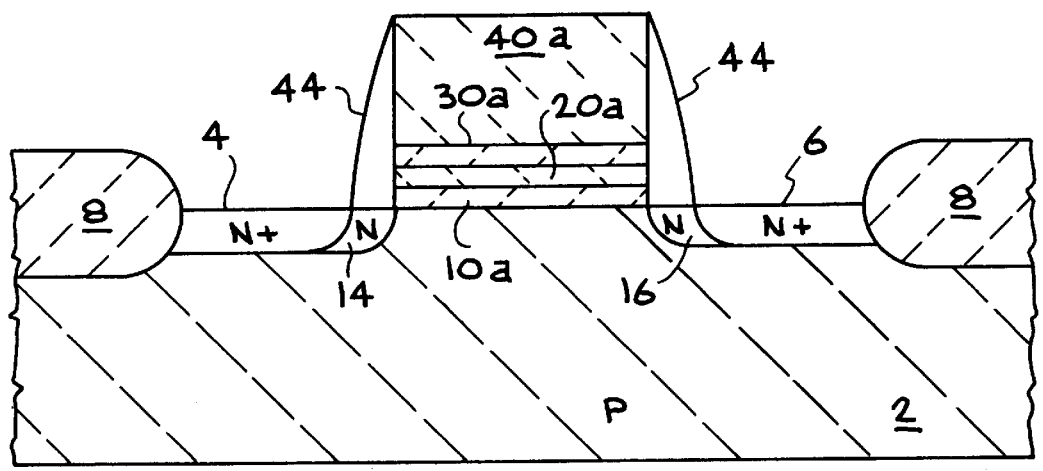
FIG. 5 is a fragmentary vertical cross-sectional view of the structure of FIG. 4 after patterning of the polysilicon layer and underlying layers to form the polysilicon gate electrode and after doping of the substrate to form the source/drain regions of an MOS device constructed in accordance with the invention.

Following the annealing step, polysilicon layer 40, underlying barrier layer 30, any silicon without nitrogen remaining in layer 20a, and gate oxide layer 10, are patterned to form polysilicon gate electrode 40a, with underlying barrier layer portion 30a, silicon portion 20b, and gate oxide portion 10a, as shown in FIG. 5.

The resulting exposed portions of semiconductor substrate 2 may then be conventionally processed, e.g., by the formation of spacers 44 on the sidewalls of gate electrode 40a, formation of N doped LDD regions 14 and 16 in substrate 2, and formation of N+ doped source/drain regions 4 and 6 of the illustrated NMOS structure in substrate 2, as also shown in FIG. 5. The MOS structure (which could be either PMOS or NMOS) is then subject to further conventional processing to form an insulation layer over the MOS structure with contact openings formed in the insulation layer to the respective gate electrode and source/drain regions, with conductive contacts then formed through such contact openings to the respective gate electrode and source/drain regions.

With respect to the formation of thin silicon layer 20 over gate oxide layer 10, the use of the term "thin" refers to a layer of silicon: (a) of sufficient minimum thickness to provide enough silicon for the subsequent formation of a barrier layer of silicon and nitrogen thick enough to prevent penetration through such barrier layer of dopant in the polysilicon gate electrode which will be constructed above barrier layer 30; and (b) of a maximum thickness which will not result in an excess of silicon left below barrier layer 30 (between the barrier layer 30 and gate oxide portion 10 after formation of barrier layer 30) sufficient to raise the Vt of the MOS device. The thickness of silicon layer 20 should, therefore, be at least about 2 nm (20 Angstroms), and preferably at least about 3 nm (30 Angstroms) to provide the desired amount of silicon for the barrier layer, while the maximum thickness of silicon layer 20 should not exceed about 10 nm (100 Angstroms) and preferably should not exceed about 6 nm (60 Angstroms), to avoid an excess of silicon (without nitrogen atoms) left between barrier layer 30 and gate oxide layer 10. This will result in a sufficient amount of silicon present to form a barrier layer of silicon and nitrogen which will not be penetrated by the dopant; while inhibiting the formation of a sufficient amount of silicon below the barrier layer (which will be therefore undoped silicon) to materially affect the Vt of the resulting MOS structure.

With respect to the formation of barrier layer 30 of nitrogen and silicon, using a nitrogen plasma, the gaseous source of nitrogen for the nitrogen plasma is preferably nitrogen ($N_2$), but may comprise any gaseous source of nitrogen which will not result in the formation of residues or byproducts (such as the undesirable liberation of hydrogen from $NH_3$) and which will provide sufficient nitrogen to form the desired barrier layer of silicon and nitrogen.

The minimum flow of the gaseous source of nitrogen into the plasma chamber should be that amount which is sufficient to sustain the nitrogen plasma in the chamber. For example, when using a plasma chamber of 30 liters in volume and nitrogen ($N_2$) as the gaseous source of nitrogen, the flow of gaseous nitrogen into the plasma chamber should range from about 10 to about 20 standard cubic centimeters per minute (sccm).

The exposure of silicon layer 20 to nitrogen plasma may be carried out at room temperature, i.e., at a temperature ranging from about 15° to about 30° C., and preferably about 20° to about 27° C., although higher temperatures, e.g., as high as 100° C., may be used, if desired. A temperature of about 60° C. has been successfully used to form the barrier layer of silicon and nitrogen. The step of exposing silicon layer 20 to the nitrogen plasma may be carried out in a conventional etching chamber at a pressure low enough to permit plasma generation. A pressure ranging from about 5 Torr to about 20 Torr has been found to be satisfactory.

The time period for the exposure of silicon layer 20 to the nitrogen plasma will be governed by the desired thickness of the barrier layer of silicon and nitrogen and the percentage of nitrogen desired in the barrier layer. The incorporation of nitrogen into the surface, i.e., the 1st nm, of silicon layer 20 to a concentration of at least about 10 atomic percent nitrogen, and preferably ranging from about 10–20 atomic percent nitrogen, has been found to be sufficient to form a barrier layer of silicon and nitrogen which will prevent penetration of dopant therethrough. Such a barrier layer of silicon and nitrogen of this thickness and concentration may be formed by exposing silicon layer 20 to the nitrogen plasma for a period of from about 2 to 20 minutes.

The energy or power level of the nitrogen plasma should be sufficient to permit breaking of the silicon—silicon bonds in silicon layer 20, but insufficient to result in any discernible sputtering of silicon atoms from the surface of silicon layer 20. Power levels which create nitrogen species which do not have energy levels exceeding about 50 electron volts (ev) will be satisfactory with regard to the inhibition of sputtering of silicon atoms from silicon layer 20 during the exposure. Preferably the energy level of the nitrogen atoms in the plasma will be about 10 ev. The use of a 200–500 watt rf plasma source, for example, in combination with an rf bias power of about 5–20 watts electrically coupled to the substrate support in the plasma chamber, will provide the desired amount of energy to the nitrogen ions in the plasma, without resulting in sputtering of the silicon atoms.

Thus, the invention provides a process and the resulting structure for forming thin polysilicon gate electrodes, i.e, less than 250 nm in height, wherein the polysilicon gate electrode may be implanted and annealed while protecting the underlying gate oxide and semiconductor substrate from the dopant diffusing therein by forming a barrier layer of silicon and nitrogen between the polysilicon gate electrode layer and the gate oxide layer, using a nitrogen plasma. The use of a nitrogen plasma, in accordance with the invention, permits formation of such a barrier layer sufficiently close to the gate oxide layer to avoid the prior art problem of the creation of a depletion zone of undoped polysilicon beneath the barrier layer which acts to increase the effective thickness of the gate oxide and to undesirably shift the Vt of the MOS device. While the practice of the invention and the resulting structure have been illustrated with respect to the construction of an NMOS device, it will be appreciated that the invention is equally applicable to PMOS structures as well.

Having thus described the invention what is claimed is:

1. A process for forming a uniformly doped polysilicon gate electrode of an MOS device comprising an integrated circuit structure formed on a semiconductor substrate which comprises:

a) forming a thin layer of amorphous or polycrystalline silicon over a gate oxide portion of said MOS device on said semiconductor substrate;

b) exposing said thin layer of silicon to a nitrogen plasma to thereby form a barrier layer of silicon and nitrogen over said gate oxide;

c) depositing polysilicon over said barrier layer of silicon and nitrogen to form said polysilicon gate electrode; and d) doping said polysilicon gate electrode by implanting said electrode with a dopant and then annealing said electrode to diffuse and activate said dopant uniformly through said polysilicon gate electrode above said barrier layer of silicon and nitrogen;

whereby said uniformly doped polysilicon gate electrode of an MOS device is formed without penetration of said dopant through said barrier layer to said gate oxide and said semiconductor substrate underlying said barrier layer.

2. The process of claim 1 wherein said nitrogen plasma is formed from $N_2$ gas.

3. The process of claim 2 wherein said step of forming said thin layer of amorphous or polycrystalline silicon over said gate oxide further comprises forming a silicon layer sufficiently thick to provide sufficient silicon to form said barrier layer of silicon and nitrogen capable of preventing diffusion of said dopant through said barrier layer to said gate oxide and said semiconductor substrate underlying said barrier layer.

4. The process of claim 2 wherein said step of forming said thin layer of amorphous or polycrystalline silicon over said gate oxide further comprises forming a silicon layer sufficiently thin to result in an amount of silicon left below said barrier layer of silicon and nitrogen incapable of causing a shift in the Vt of said MOS device.

5. The process of claim 2 wherein said step of forming said thin layer of amorphous or polycrystalline silicon over said gate oxide further comprises forming a silicon layer of from about 2 nm to about 10 nm in thickness over said gate oxide.

6. The process of claim 2 wherein said step of forming said thin layer of amorphous or polycrystalline silicon over said gate oxide further comprises forming a silicon layer of from about 3 nm to about 6 nm in thickness over said gate oxide.

7. The process of claim 2 wherein said nitrogen plasma has a power level sufficient to break silicon—silicon bonds, but insufficient to sputter silicon.

8. The process of claim 7 wherein said step of forming said barrier layer of silicon and nitrogen by said nitrogen plasma is carried out at a temperature of about 100° C. or less.

9. The process of claim 7 wherein said step of forming said barrier layer of silicon and nitrogen by said nitrogen plasma is carried out at a temperature of from about 15° C. to about 30° C.

10. The process of claim 7 wherein said step of forming said barrier layer of silicon and nitrogen by said nitrogen plasma is carried out at a temperature of from about 20° to about 27° C.

11. The process of claim 2 wherein said step of exposing said thin layer of silicon to said nitrogen plasma is carried out for at least about 5 minutes to form said barrier layer of silicon and nitrogen having a nitrogen concentration of at least about 10 atomic percent to prevent subsequent penetration of dopant from said polysilicon gate electrode above said barrier layer to said gate oxide portion beneath said barrier layer.

12. The process of claim 2 wherein said step of exposing said thin layer of silicon to said nitrogen plasma is carried out for from at least about 2 minutes to about 20 minutes to form said barrier layer of silicon and nitrogen having a nitrogen concentration of from about 10 atomic percent to about 20 atomic percent to prevent subsequent penetration of dopant from said polysilicon gate electrode above said barrier layer to said gate oxide portion beneath said barrier layer.

13. A process for forming a uniformly doped polysilicon gate electrode of an MOS device comprising an integrated circuit structure on a semiconductor substrate which comprises:

a) forming a layer of amorphous or polycrystalline silicon of from about 2 nm to about 10 nm in thickness over a gate oxide portion of said MOS device on said semiconductor substrate;

b) exposing said thin layer of silicon, at a temperature of about 100° C. or less to a nitrogen plasma formed from $N_2$ gas, said plasma having a power level sufficient to break silicon—silicon bonds, but insufficient to sputter silicon, to thereby form a barrier layer of silicon and nitrogen over said gate oxide;

c) depositing polysilicon over said barrier layer to form said polysilicon gate electrode; and d) doping said polysilicon gate electrode by implanting said electrode with a dopant and then annealing said electrode to diffuse and activate said dopant uniformly through said electrode above said barrier layer;

whereby said uniformly doped polysilicon gate electrode of an MOS device is formed without penetration of said dopant through said barrier layer of silicon and nitrogen to said gate oxide and said semiconductor substrate underlying said barrier layer.

14. The process of claim 13 wherein said step of forming said barrier layer of silicon and nitrogen by said nitrogen plasma is carried out at a temperature of from about 15° to about 30° C.

15. The process of claim 13 wherein said step of forming said thin layer of amorphous or polycrystalline silicon over said gate oxide further comprises forming a silicon layer of from about 3 nm to about 6 nm in thickness over said gate oxide.

* * * * *